(12) United States Patent
Wilkas (10) Patent No.: US 11,697,213 B2
(45) Date of Patent: Jul. 11, 2023

(54) RADAR BASED POSITION MEASUREMENT FOR ROBOT SYSTEMS

(71) Applicant: Persimmon Technologies, Corp., Wakefield, MA (US)

(72) Inventor: Scott Wilkas, Lexington, MA (US)

(73) Assignee: Persimmon Technologies Corporation, Wakefield, MA (US)

( * ) Notice: Subject to any disclaimer, the term of this patent is extended or adjusted under 35 U.S.C. 154(b) by 601 days.

(21) Appl. No.: 16/788,880

(22) Filed: Feb. 12, 2020

(65) Prior Publication Data

US 2020/0262088 A1 Aug. 20, 2020

Related U.S. Application Data

(60) Provisional application No. 62/805,554, filed on Feb. 14, 2019.

(51) Int. Cl.
| | | |
|---|---|---|
| *G01S 13/88* | (2006.01) | |
| *B25J 19/02* | (2006.01) | |
| *H01L 21/67* | (2006.01) | |
| *B25J 11/00* | (2006.01) | |

(52) U.S. Cl.
CPC ......... *B25J 19/021* (2013.01); *B25J 11/0095* (2013.01); *B25J 19/026* (2013.01); *G01S 13/881* (2013.01); *H01L 21/67259* (2013.01)

(58) Field of Classification Search
CPC .... B25J 11/0095; B25J 13/089; B25J 19/021; B25J 19/026; G01S 13/42; G01S 13/58; G01S 13/881; G01S 15/42; G01S 15/58; G01S 15/88; G01S 17/58; G01S 17/87; G01S 17/88; G01S 2205/01; G01S 5/0284; H01L 21/67259; H01L 21/67742
See application file for complete search history.

(56) References Cited

U.S. PATENT DOCUMENTS

| | | | |
|---|---|---|---|
| 5,546,179 A | 8/1996 | Cheng | |
| 5,563,798 A | 10/1996 | Berken et al. | |
| 6,502,054 B1 | 12/2002 | Mooring et al. | |
| 6,577,923 B1 | 6/2003 | White et al. | |
| 9,196,518 B1 | 11/2015 | Hofmeister et al. | |
| 10,215,852 B1 * | 2/2019 | Byrne | G01S 13/881 |
| 2008/0135788 A1 | 6/2008 | Fogel | |
| 2009/0093906 A1 * | 4/2009 | Takizawa | H01L 21/68707 700/214 |
| 2009/0182454 A1 * | 7/2009 | Donoso | H01L 21/681 700/254 |
| 2013/0080099 A1 | 3/2013 | Akada | |
| 2014/0234991 A1 | 8/2014 | Douki et al. | |
| 2018/0052228 A1 * | 2/2018 | Markison | H04Q 9/00 |
| 2018/0361595 A1 | 12/2018 | Troy et al. | |
| 2021/0239794 A1 * | 8/2021 | Fauth | G01S 7/4078 |

* cited by examiner

*Primary Examiner* — Timothy A Brainard
(74) *Attorney, Agent, or Firm* — Harrington & Smith (57) ABSTRACT

An apparatus including at least one emitter configured to emit energy; at least one receiver configured to receive the emitted energy, where the at least one emitter is mounted on at least one of: a robot arm, an end effector of the robot arm, a substrate on the robot arm, or a substrate process module, where the at least one receiver is mounted on at least one of: the robot arm, the end effector of the robot arm, the substrate on the robot arm, or the substrate process module.

20 Claims, 6 Drawing Sheets

RADAR BASED POSITION MEASUREMENT FOR ROBOT SYSTEMS

CROSS REFERENCE TO RELATED APPLICATION

This application claims priority under 35 USC 119(e) to U.S. provisional application No. 62/805,554 filed Feb. 14, 2019 which is hereby incorporated by reference in its entirety.

BACKGROUND

Technical Field

The example and non-limiting embodiments relate generally to a robot and, more particularly, to a positioning system for a robot.

Brief Description of Prior Developments

U.S. Pat. No. 9,196,518, which is hereby incorporated by reference in its entirety, discloses an adaptive placement system and method for a substrate transport robot.

SUMMARY

The following summary is merely intended to be exemplary. The summary is not intended to limit the scope of the claims.

In accordance with one aspect, an example embodiment is provided in an apparatus comprising: at least one emitter configured to emit energy; at least one receiver configured to receive the emitted energy, where the at least one emitter is mounted on at least one of: a robot arm, an end effector of the robot arm, a substrate on the robot arm, or a substrate process module, where the at least one receiver is mounted on at least one of: the robot arm, the end effector of the robot arm, the substrate on the robot arm, or the substrate process module.

In accordance with another aspect, an example method is provided comprising: mounting at least one emitter on at least one of: a robot arm, an end effector of the robot arm, a substrate on the robot arm, or a substrate process module, where the at least one receiver is configured to emit energy; mount at least one receiver on at least one of: the robot arm, the end effector of the robot arm, the substrate on the robot arm, or the substrate process module, where the at least one receiver is configured to receive the emitted energy.

In accordance with another aspect, an example method is provided comprising: emitting energy from an emitter, receiving the emitted energy by a receiver, where the at least one emitter is mounted on at least one of: a robot arm, an end effector of the robot arm, a substrate on the robot arm, or a substrate process module, where the at least one receiver is mounted on at least one of: the robot arm, the end effector of the robot arm, the substrate on the robot arm, or the substrate process module; based, at least partially, upon the energy received by the at least one receiver, determining: at least one of: a position, and/or range, and/or angle, and/or velocity of the substrate, or a position, and/or range, and/or angle, and/or velocity of the robot arm, or a position, and/or range, and/or angle, and/or velocity of the end effector, relative to the substrate process module, or a position of the substrate on the end effector and/or the robot arm.

BRIEF DESCRIPTION OF THE DRAWINGS

The foregoing aspects and other features are explained in the following description, taken in connection with the accompanying drawings, wherein.

DETAILED DESCRIPTION OF EMBODIMENTS

Figure 1:
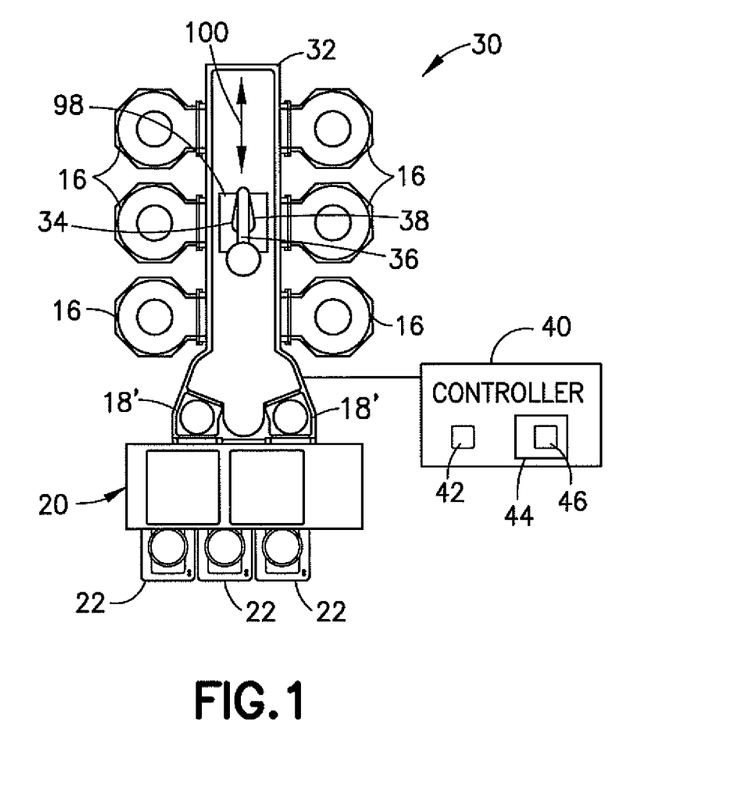
FIG. 1 is a schematic top plan view illustrating an example embodiment comprising features as described herein.

Referring to FIG. 1, there is shown a schematic top view of a substrate processing apparatus 30 incorporating features of an example embodiment. Although the features will be described with reference to the example embodiments shown in the drawings, it should be understood that features can be embodied in many alternate forms of embodiments. In addition, any suitable size, shape or type of elements or materials could be used.

Figure 2A:
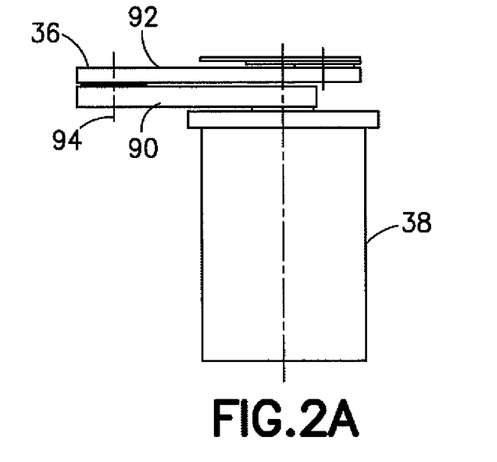
FIG. 2A is a side view of a portion of the robot shown in FIG. 1.
Figure 2B:
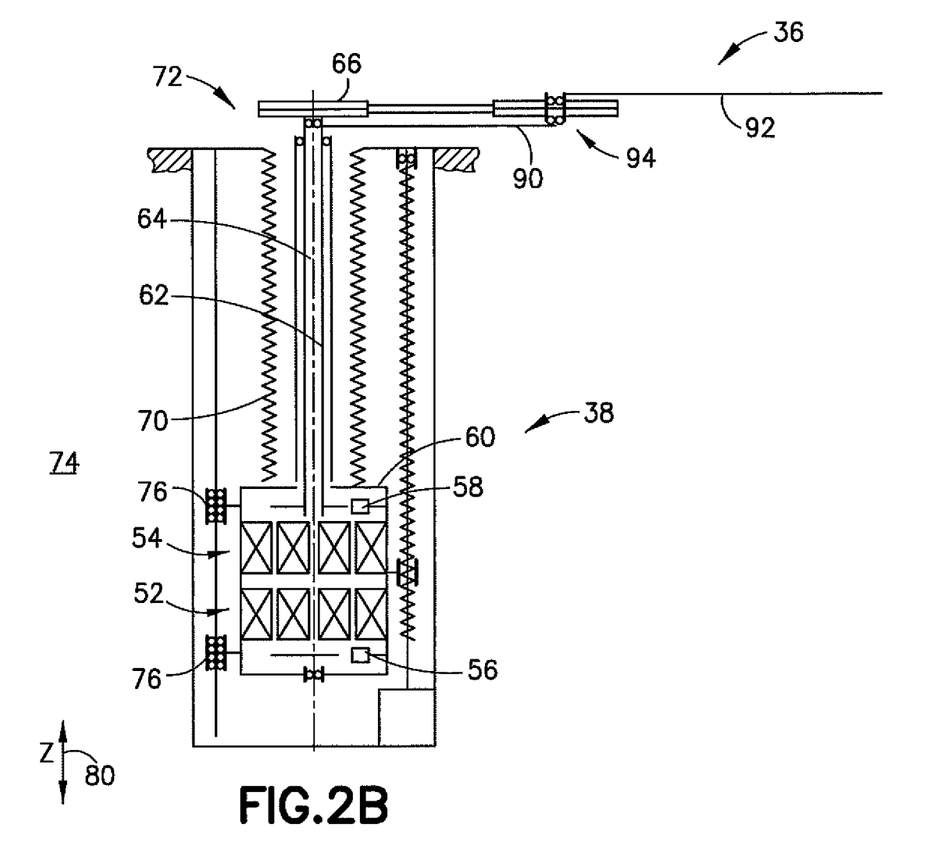
FIG. 2B is a schematic sectional view of the robot shown in FIG. 2A.

The substrate processing apparatus 30 generally comprises a substrate transport chamber 32, the substrate processing modules 16, load locks 18', the Equipment Front End Module (EFEM) 20 having substrate cassette elevators 22, and a linear robot 34 comprising a two-link arm 36 and a robot drive 38 (see FIGS. 2A-2B). The apparatus 30 is connected to a controller 40 which comprises at least one processor 42 and at least one memory 44 including computer program code 46. FIG. 1 is an example of the linear robot having the two-link arm in a compact retract position.

Referring also to FIGS. 2A-2B, the two-link arm 36 generally comprises an upper arm 90 and an end effector 92 rotatably connected to the upper arm 90 a joint 94. The robot drive 38 comprises first and second motors 52, 54 with corresponding first and second encoders 56, 58 coupled to housing 60 and respectively driving first and second shafts 62, 64. Here shaft 62 may be coupled to pulley 66 and shaft 64 may be coupled to upper arm 90 where shafts 62, 64 may be concentric or otherwise disposed. In alternate aspects, any suitable drive may be provided. Housing 60 may be in communication with chamber 68 where bellows 70, chamber 68 and an internal portion of housing 60 isolate a vacuum environment 72 from an atmospheric environment 74. Housing 60 may slide in a Z direction as a carriage on slides 76 where a lead screw or other suitable vertical or linear Z drive 78 may be provided to selectively move housing 60 and two-link arm 36 coupled there to in a Z 80 direction. The robot 34 is mounted on a linear transport apparatus 98 which is configured to move the robot 36 along a linear path inside the chamber 32 as indicated by arrow 100 in FIG. 1. This may be with use of rails or maglev for example.

Modern semiconductor process technology is constantly striving to fit more devices in smaller packages. Processing smaller devices requires greater positional repeatability and accuracy from wafer handling equipment. Traditional wafer handling robots use encoder based position feedback to track the position of the input side of a mechanical arm linkage or transmission, but rely primarily on the repeatability of the mechanical transmission to deliver the payload on the output side of the linkage or transmission in a repeatable and accurate position. Some systems use external sensors to measure wafer position relative to the commanded robot position, but this method also relies on the precision of the mechanical transmission.

In one example embodiment having features as described herein, a sensor may be located on the output side of the linkage or mechanical transmission which is configured to measure the location of the payload (such as a substrate) relative to the robot's actual end effector and/or measure the robot's position relative to features around a transfer point and/or validate wafer delivery position relative to a transfer point after wafer placement would allow the robot control system to adapt for initial wafer position, wafer slippage, or mechanism changes over time like mechanical wear, thermal expansion, or deflection due to payload weight. One method for this type of sensing would be to use a local radar system mounted to the robot base, arm, or end effector that could see or sense the robot payload or robot environment. Another example method would be to mount the radar to the system and measure the robot or substrate position.

Figure 3:
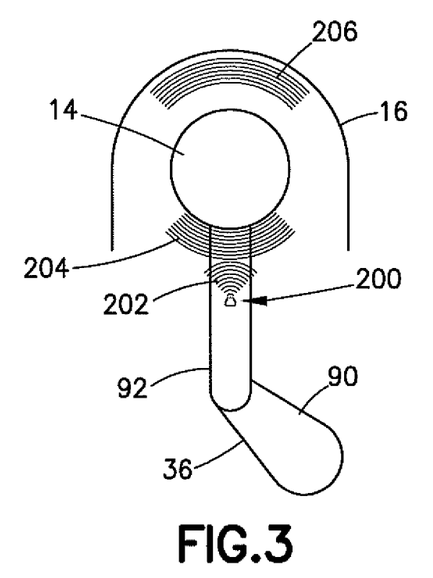
FIG. 3 is a schematic top view of illustrating one example of the system for use in the embodiment shown in FIG. 1.

Referring to FIG. 3, a schematic top view is shown illustrating one example embodiment. The robot arm 36 is shown holding a substrate 14 on the end effector 92 and positioning the substrate 14 into the processing module 16. The robot arm 36 comprises a radar emitter and receiver 200 on the robot arm 36. The radar emitter and receiver 200 is configured to emit radio waves as illustrated by 202 then detect reflected waves 204 from the substrate 14 and reflected waves 206 from the processing chamber 16. The reflected waves 204, 206 detected by the radar emitter and receiver 200 may be used to determine the location, range, angle, or velocity of substrate 14 and processing chamber. This may be relative to the robot arm 36 and/or relative to each other. In an alternate embodiment, rather than radar an optical system might be used or a sonar system could be used. Alternatively, a combination of these systems or any other non-contact sensing system could be used.

Figure 4:
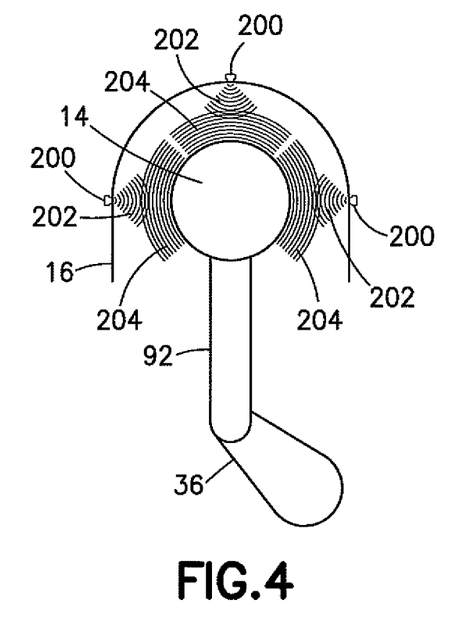
FIG. 4 is a schematic top view of illustrating one example of the system for use in the embodiment shown in FIG. 1.

Referring also to FIG. 4, as an alternative to the system shown in FIG. 3, or as an addition to the system shown in FIG. 3, the processing module 16 may comprise one or more radar emitter and receiver 200 on an interior wall of the processing module 16. FIG. 4 shows three (3) of the radar emitter and receiver 200 on an interior wall of the processing module 16. The radar emitter and receivers 200 are configured to emit radio waves as illustrated by 202 then detect reflected waves 204 from the substrate 14 (and perhaps also the end effector 92). The reflected waves 204, 206 detected by the radar emitter and receiver 200 may be used to determine the location, range, angle, or velocity of substrate 14 (and end effector 92) relative to the processing chamber 16. In an alternate embodiment, rather than radar an optical system might be used or a sonar system could be used. Alternatively, a combination of these systems or any other non-contact sensing system could be used.

Figure 5:
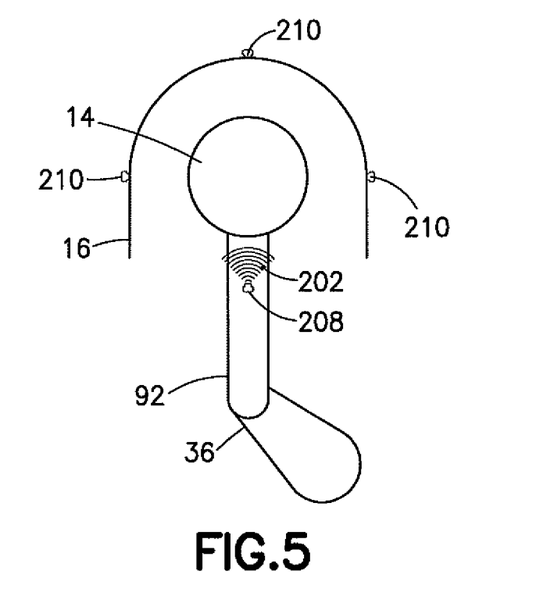
FIG. 5 is a schematic top view of illustrating one example of the system for use in the embodiment shown in FIG. 1.

Referring also to FIG. 5, another example embodiment is shown, This may be used separately from the embodiments shown in FIGS. 3-4 or in addition to features in those embodiments. The robot arm 36 is shown holding a substrate 14 on the end effector 92 and positioning the substrate 14 into the processing module 16. The robot arm 36 comprises a radar emitter 208 on the robot arm 36. The radar emitter 208 is configured to emit radio waves as illustrated by 202. The waves 202 are detected by the receivers 210 on the walls of the processing module 16. The waves 202 may be used to determine the location, range, angle, or velocity of substrate 14 and the end effector 92. In an alternate embodiment, rather than radar an optical system might be used or a sonar system could be used. Alternatively, a combination of these systems or any other non-contact sensing system could be used.

Figure 6:
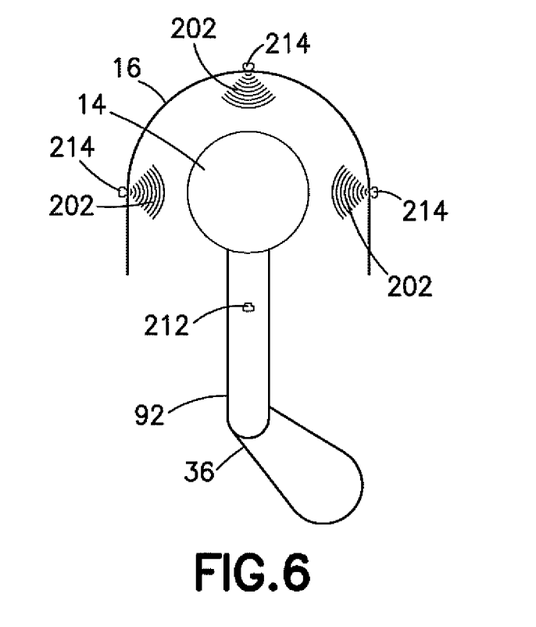
FIG. 6 is a schematic top view of illustrating one example of the system for use in the embodiment shown in FIG. 1.

Referring also to FIG. 6, another example embodiment is shown. This may be used separately from the embodiments shown in FIGS. 3-5 or in addition to features in those embodiments. The robot arm 36 is shown holding a substrate 14 on the, end effector 92 and positioning the substrate 14 into the processing module 16. The robot arm 36 comprises a radar receiver 212 on the robot arm 36. The processing module 16 comprises radar transmitters 214 on the walls of the processing module 16. The radar transmitters 214 are configured to emit radio waves as illustrated by 202. The waves 202 are detected by the receiver 212. The waves 202 may be used to determine the location, range, angle, or velocity of substrate 14 and the end effector 92. In an alternate embodiment, rather than radar an optical system might be used or a sonar system could be used. Alternatively, a combination of these systems or any other non-contact sensing system could be used.

Figure 7:
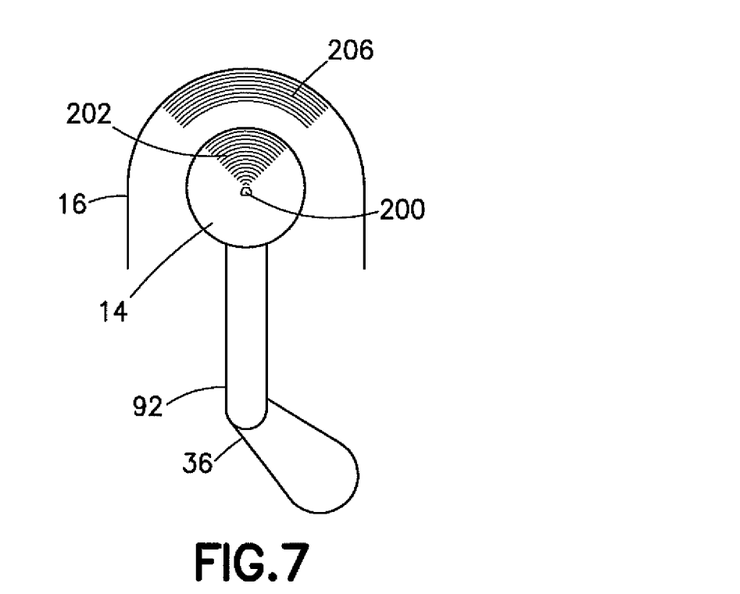
FIG. 7 is a schematic top view of illustrating one example of the system for use in the embodiment shown in FIG. 1.

Referring also to FIG. 7, another example embodiment is shown. This may be used separately from the embodiments shown in FIGS. 3-6 or in addition to features in those embodiments. The robot arm 36 is shown holding a substrate 14 on the end effector 92 and positioning the substrate 14 into the processing module 16. This figures illustrates a substrate or fixture sourced and measured end point position. A radar emitter(s) and receiver(s) 200 may be located on substrate or fixture carried by robot 36. The radar emitter and receiver 200 is configured to emit radio waves as illustrated by 202 and then detect reflected waves 206 from the processing chamber 16. The reflected waves 206 detected by the radar emitter and receiver 200 may be used to determine the location, range, angle, or velocity. In an alternate embodiment, rather than radar an optical system might be used or a sonar system could be used. Alternatively, a combination of these systems or any other non-contact sensing system could be used.

Figure 8:
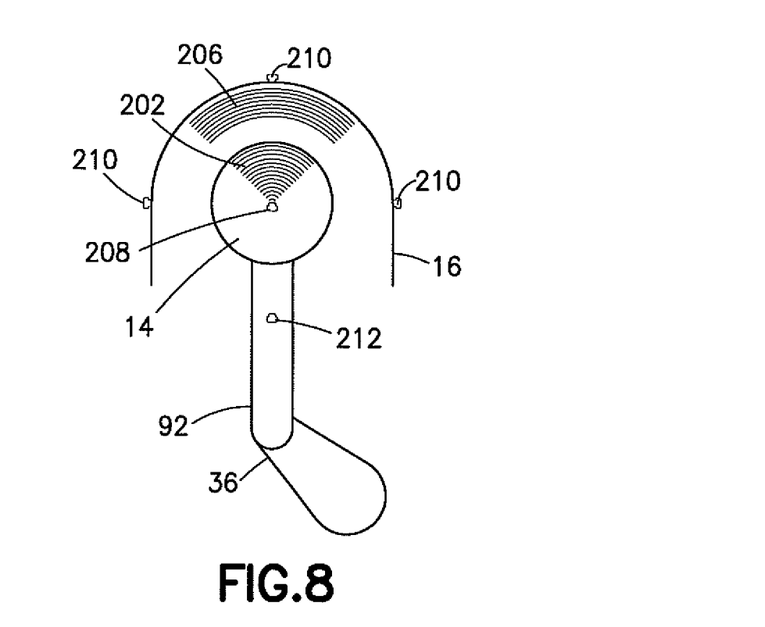
FIG. 8 is a schematic top view of illustrating one example of the system for use in the embodiment shown in FIG. 1.

Referring also to FIG. 8, another example embodiment is shown. This may be used separately from the embodiments shown in FIGS. 3-7 or in addition to features in those embodiments. The robot arm 36 is shown holding a substrate 14 on the end effector 92 and positioning the substrate 14 into the processing module 16. This figure illustrates a substrate or fixture sourced and system or robot measured end point position. A radar emitter(s) 208 is located on the substrate or fixture carried by robot and receiver(s) 210 are located on the processing module 16 and receiver(s) 212 are located on the robot 36. The waves 202 and 206 may be used to determine location, range, angle, or velocity. In an alternate embodiment, rather than radar an optical system might be used or a sonar system could be used. Alternatively, a combination of these systems or any other non-contact sensing system could be used.

Figure 9:
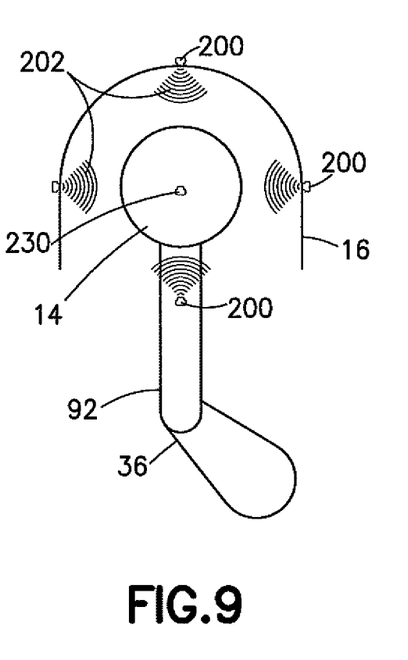
FIG. 9 is a schematic top view of illustrating one example of the system for use in the embodiment shown in FIG. 1.

Referring also to FIG. 9, another example embodiment is shown. This may be used separately from the embodiments shown in FIGS. 3-8 or in addition to features in those embodiments. The robot arm 36 is shown holding a substrate 14 on the end effector 92 and positioning the substrate 14 into the processing module 16. This figure illustrates a system or robot sourced and substrate or fixture measured end point position. Radar receiver(s) 230 are located on the substrate or a fixture carried by robot 36 and emitter(s) 200 are located on robot or system. The waves 202 may be used to determine location, range, angle, or velocity. In an alternate embodiment, rather than radar an optical system might be used or a sonar system could be used. Alternatively, a combination of these systems or any other non-contact sensing system could be used.

Radar based position measurement for robot systems could be used for, but not limited to:
Substrate presence detection
Substrate broken detection
Substrate position measurement relative to robot arm or system features
Substrate position correction relative to robot arm or system features
Robot endpoint position measurement relative to system features or surroundings
Detecting performance changes over time in robot position, speed, acceleration, vibration
Detecting changes in environment, physical dimensions, shape, or position
Teaching, validating, or adjusting robot mechanical setup and reference positions
Teaching, validating, or adjusting robot transfer positions
Obstruction detection within robot workspace
Safety interlock validation (slot valve door open/close validation before robot arm extension)
Error recovery, location of robot in system, location of payload, payload broken, robot mechanism performance/damage after a collision
Human operator, maintenance technician, collaborative robot/machine, or AGV presence in robot workspace Sensor mounting configurations could be arranged in, but not limited to, these configurations:
Radar emitter(s) and receiver(s) mounted to robot (see FIG. 3 for example)
Radar emitter(s) and receiver(s) mounted to system (see FIG. 4 for example)
Radar emitter(s) mounted to robot and receiver(s) mounted to system (see FIG. 5 for example)
Radar emitter(s) mounted to system and receiver(s) mounted to robot (see FIG. 6 for example)

An example apparatus may be provided comprising:
at least one emitter configured to emit energy;
at least one receiver configured to receive the emitted energy,
where the at least one emitter is mounted on at least one of:
  a robot arm,
  an end effector of the robot arm,
  a substrate on the robot arm, or
  a substrate process module,
where the at least one receiver is mounted on at least one of:
  the robot arm,
  the end effector of the robot arm,
  the substrate on the robot arm, or
  the substrate process module.

The emitted energy may comprise at least one of:
radio waves,
optical energy, or
sound energy.

The at least one emitter and the at least one receiver may comprise a transceiver configured to both emit the emitted energy and receive reflected energy as the received energy.

The at least one receiver may be configured to receive the emitted energy as reflected energy which has been reflected from at least one of:
the robot arm,
the end effector on the robot arm,
the substrate on the robot arm, or
the substrate process module.

The at least one emitter may be mounted on the robot arm and the at least one receiver is mounted on the robot arm.

The at least one emitter may comprise a plurality of the emitter, where the plurality of emitters are mounted to a chamber of the substrate process module and have respective different energy transmission directions which are towards a center substrate positioning area in the chamber.

The at least one emitter may be mounted on the robot arm and the at least one receiver is mounted on the substrate process module, where the at least one receiver comprises a plurality of the receiver, where the plurality of receivers are located at different angular positions relative to a center of a chamber of the substrate process module.

The at least one emitter may be mounted to the substrate process module, where the at least one emitter comprises a plurality of the emitter, where the plurality of emitters are located at different angular positions relative to a center of a chamber of the substrate process module, and where the at least one receiver is located on the robot arm.

The at least one emitter and the at least one receiver may be mounted on the substrate.

The at least one emitter may be mounted on the substrate, where the at least one receiver comprises a plurality of the receiver, where the plurality of receivers are located at different angular positions relative to a center of a chamber of the substrate process module.

The at least one emitter may be mounted to the robot arm and the substrate process module, where the at least one emitter comprises a plurality of the emitter, where the plurality of emitters on the substrate process module are located at different angular positions relative to a center of a chamber of the substrate process module, and where the at least one receiver is located on the substrate.

An example method may be provided comprising:
mounting at least one emitter on at least one of:
  a robot arm,
  an end effector of the robot arm,
  a substrate on the robot arm, or
  a substrate process module,
  where the at least one receiver is configured to emit energy;
mount at least one receiver on at least one of:
  the robot arm,
  the end effector of the robot arm,
  the substrate on the robot arm, or
  the substrate process module,
  where the at least one receiver is configured to receive the emitted energy.

The at least one emitter and the at least one receiver may comprise a transceiver configured to both emit the emitted energy and receive reflected energy as the received energy.

The receiver may be configured to receive the emitted energy as reflected energy which has been reflected from at least one of:

the robot arm,
the end effector on the robot arm,
the substrate on the robot arm, or
the substrate process module.

The at least one emitter may be mounted on the robot arm and the at least one receiver is mounted on the robot arm. The at least one emitter may comprise a plurality of the emitter, where the plurality of emitters are mounted to a chamber of the substrate process module and have respective different energy transmission directions which are towards a center substrate positioning area in the chamber. The at least one emitter may be mounted on the robot arm and the at least one receiver is mounted on the substrate process module, where the at least one receiver comprises a plurality of the receiver, where the plurality of receivers are located at different angular positions relative to a center of a chamber of the substrate process module. The at least one emitter may be mounted to the substrate process module, where the at least one emitter comprises a plurality of the emitter, where the plurality of emitters are located at different angular positions relative to a center of a chamber of the substrate process module, and where the at least one receiver is located on the robot arm. The at least one emitter and the at least one receiver may be mounted on the substrate. The at least one emitter may be mounted on the substrate, and where the at least one receiver comprises a plurality of the receiver, where the plurality of receivers are located at different angular positions relative to a center of a chamber of the substrate process module. The at least one emitter may be mounted to the robot arm and the substrate process module, where the at least one emitter comprises a plurality of the emitter, where the plurality of emitters on the substrate process module are located at different angular positions relative to a center of a chamber of the substrate process module, and where the at least one receiver is located on the substrate.

An example method may be provided comprising:
emitting energy from an emitter,
receiving the emitted energy by a receiver,
where the at least one emitter is mounted on at least one of:
a robot arm,
an end effector of the robot arm,
a substrate on the robot arm, or
a substrate process module,
where the at least one receiver is mounted on at least one of:
the robot arm,
the end effector of the robot arm,
the substrate on the robot arm, or
the substrate process module;
based, at least partially, upon the energy received by the at least one receiver, determining:
at least one of:
a position, and/or range, and/or angle, and/or velocity of the substrate,
a position, and/or range, and/or angle, and/or velocity of the robot arm, or
a position, and/or range, and/or angle, and/or velocity of the end effector,
relative to the substrate process module, or
a position of the substrate on the end effector and/or the robot arm.

An example apparatus may be provided comprising at least one processor; and at least one non-transitory memory including computer program code, the at least one memory and the computer program code configured to, with the at least one processor, cause the apparatus to:
cause emitting of energy from an emitter, and receiving of the emitted energy by a receiver,
where the at least one emitter is mounted on at least one of:
a robot arm,
an end effector of the robot arm,
a substrate on the robot arm, or
a substrate process module,
where the at least one receiver is mounted on at least one of:
the robot arm,
the end effector of the robot arm,
the substrate on the robot arm, or
the substrate process module; and
based, at least partially, upon the energy received by the at least one receiver,
determine at least one of:
a position, and/or range, and/or angle, and/or velocity of the substrate,
a position, and/or range, and/or angle, and/or velocity of the robot arm, or
a position, and/or range, and/or angle, and/or velocity of the end effector,
relative to the substrate process module, or
determine a position of the substrate on the end effector and/or the robot arm.

An example apparatus may be provided comprising:
means for emitting energy from an emitter,
means for receiving the emitted energy by a receiver,
where the at least one emitter is mounted on at least one of:
a robot arm,
an end effector of the robot arm,
a substrate on the robot arm, or
a substrate process module,
where the at least one receiver is mounted on at least one of:
the robot arm,
the end effector of the robot arm,
the substrate on the robot arm, or
the substrate process module; and
means, based at least partially upon the energy received by the at least one receiver, for:
determining at least one of:
a position, and/or range, and/or angle, and/or velocity of the substrate,
a position, and/or range, and/or angle, and/or velocity of the robot arm, or
a position, and/or range, and/or angle, and/or velocity of the end effector,
relative to the substrate process module, or
determining a position of the substrate on the end effector and/or the robot arm.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An apparatus comprising:
 at least one emitter configured to emit energy;
 at least one receiver configured to receive the emitted energy,
 where the at least one emitter is mounted on at least one of:
  a robot arm,
  an end effector of the robot arm,
  a substrate on the robot arm, or
  a substrate process module,
 where the at least one receiver is mounted on at least one of:
  the robot arm,
  the end effector of the robot arm,
  the substrate on the robot arm, or
  the substrate process module;
 where the at least one emitter comprises a plurality of emitters, where the plurality of emitters are mounted to a chamber of the substrate process module and have respective different energy transmission directions which are towards a center substrate positioning area in the chamber.

2. The apparatus as in claim 1 where the emitted energy comprises at least one of:
 radio waves,
 optical energy, or
 sound energy.

3. The apparatus as in claim 1 where the at least one emitter and the at least one receiver comprise a transceiver configured to both, emit the emitted energy and receive reflected energy as the received energy.

4. The apparatus as in claim 1 where the at least one receiver is configured to receive the emitted energy as reflected energy which has been reflected from at least one of:
 the robot arm,
 the end effector on the robot arm,
 the substrate on the robot arm, or
 the substrate process module.

5. The apparatus as in claim 1 where the at least one emitter is mounted on the robot arm and the at least one receiver is mounted on the robot arm.

6. The apparatus as in claim 1 where the at least one emitter is mounted on the robot arm and the at least one receiver is mounted on the substrate process module, where the at least one receiver comprises a plurality of receivers, where the plurality of receivers are located at different angular positions relative to a center of a chamber of the substrate process module.

7. The apparatus as in claim 1 where the at least one emitter is mounted to the substrate process module, where the at least one emitter comprises a plurality of emitters, where the plurality of emitters are located at different angular positions relative to a center of a chamber of the substrate process module, and where the at least one receiver is located on the robot arm.

8. The apparatus as in claim 1 where the at least one emitter and the at least one receiver are mounted on the substrate.

9. The apparatus as in claim 1 where the at least one emitter is mounted on the substrate, and where the at least one receiver comprises a plurality of receivers, where the plurality of receivers are located at different angular positions relative to a center of a chamber of the substrate process module.

10. The apparatus as in claim 1 where the at least one emitter is mounted to the robot arm and the substrate process module, where the at least one emitter comprises a plurality of emitters, where the plurality of emitters on the substrate process module are located at different angular positions relative to a center of a chamber of the substrate process module, and where the at least one receiver is located on the substrate.

11. A method comprising:
 mounting at least one emitter on at least one of:
  a robot arm,
  an end effector of the robot arm,
  a substrate on the robot arm, or
  a substrate process module,
 where the at least one emitter is configured to emit energy;
 mount at least one receiver on at least one of:
  the robot arm,
  the end effector of the robot arm,
  the substrate on the robot arm, or
  the substrate process module,
 where the at least one receiver is configured to receive the emitted energy;
 where the at least one emitter comprises a plurality of emitters, where the plurality of emitters are mounted to a chamber of the substrate process module and have respective different energy transmission directions which are towards a center substrate positioning area in the chamber.

12. The method as in claim 11 where the at least one emitter and the at least one receiver comprise a transceiver configured to both emit the emitted energy and receive reflected energy as the received energy.

13. The method as in claim 11 where the receiver is configured to receive the emitted energy as reflected energy which has been reflected from at least one of:
 the robot arm,
 the end effector on the robot arm,
 the substrate on the robot arm, or
 the substrate process module.

14. The method as in claim 11 where the at least one emitter is mounted on the robot arm and the at least one receiver is mounted on the robot arm.

15. The method as in claim 11 where the at least one emitter is mounted on the robot arm and the at least one receiver is mounted on the substrate process module, where the at least one receiver comprises a plurality of receivers, where the plurality of receivers are located at different angular positions relative to a center of a chamber of the substrate process module.

16. The method as in claim 11 where the at least one emitter is mounted to the substrate process module, where the at least one emitter comprises a plurality of emitters, where the plurality of emitters are located at different angular positions relative to a center of a chamber of the substrate process module, and where the at least one receiver is located on the robot arm.

17. The method as in claim 11 where the at least one emitter and the at least one receiver are mounted on the substrate.

18. The method as in claim 11 where the at least one emitter is mounted on the substrate, and where the at least one receiver comprises a plurality of receivers, where the plurality of receivers are located at different angular positions relative to a center of a chamber of the substrate process module.

19. The method as in claim 11 where the at least one emitter is mounted to the robot arm and the substrate process module, where the at least one emitter comprises a plurality of emitters, where the plurality of emitters on the substrate process module are located at different angular positions relative to a center of a chamber of the substrate process module, and where the at least one receiver is located on the substrate.

20. A method comprising:
emitting energy from an emitter,
receiving the emitted energy by a receiver,
where the at least one emitter is mounted on at least one of:
  a robot arm,
  an end effector of the robot arm,
  a substrate on the robot arm, or
  a substrate process module,
where the at least one receiver is mounted on at least one of:
  the robot arm,
  the end effector of the robot arm,
  the substrate on the robot arm, or
  the substrate process module;
based, at least partially, upon the energy received by the at least one receiver, determining:
at least one of:
a position, and/or range, and/or angle, and/or velocity of the substrate,
a position, and/or range, and/or angle, and/or velocity of the robot arm, or
a position, and/or range, and/or angle, and/or velocity of the end effector,
relative to the substrate process module, or
a position of the substrate on the end effector and/or the robot arm;
where the at least one emitter comprises a plurality of emitters, where the plurality of emitters are mounted to a chamber of the substrate process module and have respective different energy transmission directions which are towards a center substrate positioning area in the chamber.

* * * * *